US011232966B2

(12) United States Patent
Thomas et al.

(10) Patent No.: US 11,232,966 B2
(45) Date of Patent: Jan. 25, 2022

(54) ELECTROSTATIC CHUCKING PEDESTAL WITH SUBSTRATE BACKSIDE PURGING AND THERMAL SINKING

(71) Applicant: Lam Research Corporation, Fremont, CA (US)

(72) Inventors: Timothy S. Thomas, Wilsonville, OR (US); Patrick Breiling, Portland, OR (US); Ramesh Chandrasekharan, Portland, OR (US); Vincent Burkhart, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 274 days.

(21) Appl. No.: 15/886,098

(22) Filed: Feb. 1, 2018

(65) Prior Publication Data

US 2019/0237353 A1    Aug. 1, 2019

(51) Int. Cl.
| | |
|---|---|
| *H01L 21/683* | (2006.01) |
| *H01L 21/67* | (2006.01) |
| *H01L 21/687* | (2006.01) |
| *H02N 13/00* | (2006.01) |
| *H01J 37/32* | (2006.01) |

(52) U.S. Cl.
CPC .... *H01L 21/6833* (2013.01); *H01J 37/32082* (2013.01); *H01J 37/32724* (2013.01); *H01L 21/67126* (2013.01); *H01L 21/6831* (2013.01); *H01L 21/68792* (2013.01); *H02N 13/00* (2013.01); *H01J 2237/002* (2013.01); *H01J 2237/332* (2013.01)

(58) Field of Classification Search
CPC ............ H01L 21/6833; H01L 21/68792; H01J 2237/002
See application file for complete search history.

(56) References Cited

U.S. PATENT DOCUMENTS

| | | | | |
|---|---|---|---|---|
| 5,099,571 A | * | 3/1992 | Logan | ................. H01L 21/6831 29/825 |
| 2009/0014323 A1 | * | 1/2009 | Yendler | ................... H01J 37/20 204/298.33 |
| 2013/0284374 A1 | * | 10/2013 | Lubomirsky | .......... H02N 13/00 156/345.51 |
| 2014/0290862 A1 | | 10/2014 | Sugi | |
| 2015/0376780 A1 | | 12/2015 | Khaja et al. | |
| 2016/0204044 A1 | | 7/2016 | Gurary et al. | |

OTHER PUBLICATIONS

DuPont Kalrez Parts Chemical Resistance, 2019. p. 2 https://www.dupont.com/knowledge/chemical-resistance-kalrez-parts.html (Year: 2019).*
International Search Report from International Application No. PCT/US2019/015424 dated May 14, 2019.
Written Opinion from International Application No. PCT/US2019/015424 dated May 14, 2019.

* cited by examiner

*Primary Examiner* — Dah-Wei D. Yuan
*Assistant Examiner* — Stephen A Kitt
(74) *Attorney, Agent, or Firm* — Beyer Law Group LLP

(57) ABSTRACT

An electrostatic substrate chuck with substrate backside purging to prevent incidental backside deposition and that provides thermal sinking to prevent or mitigate the failure of seals.

19 Claims, 4 Drawing Sheets

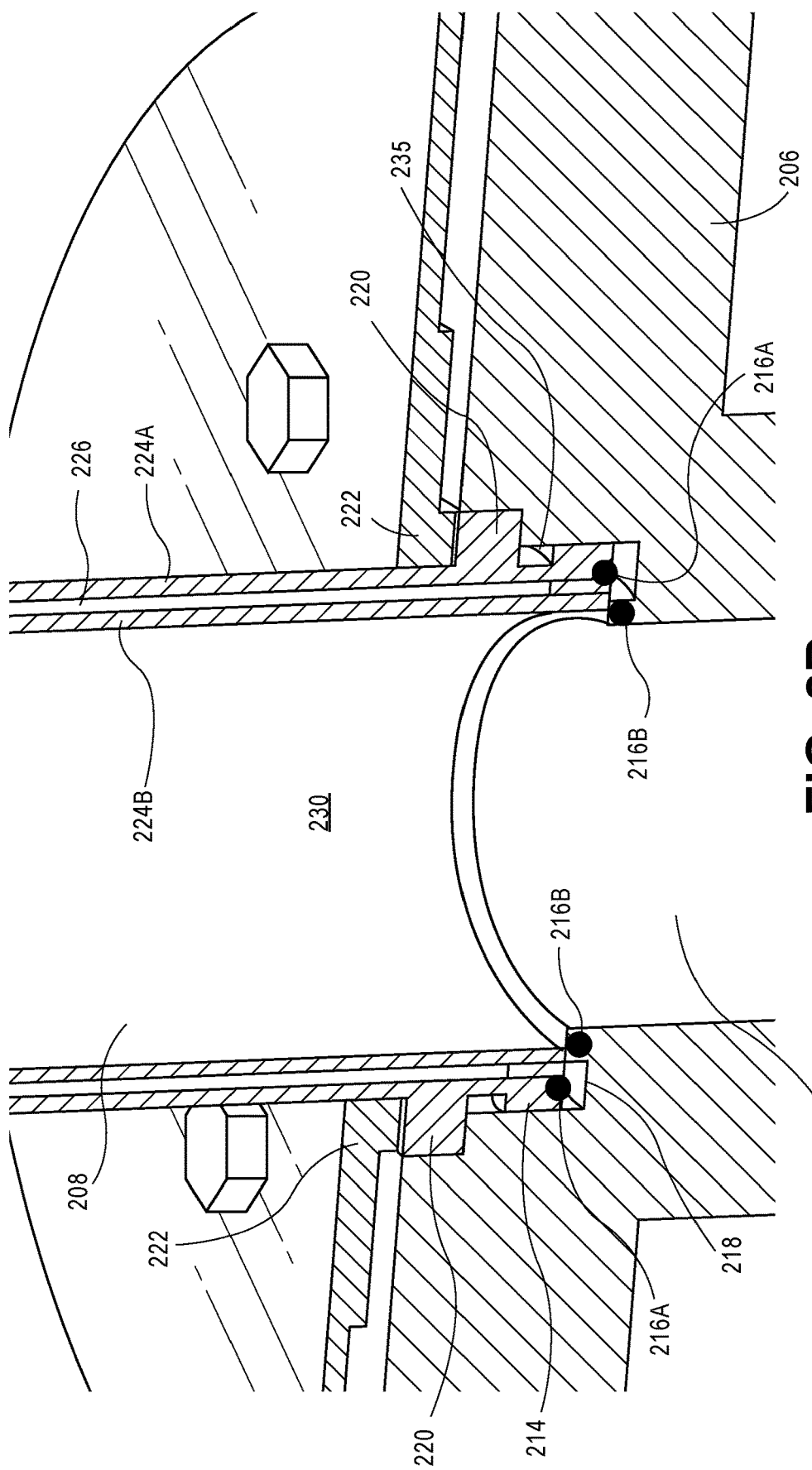

ELECTROSTATIC CHUCKING PEDESTAL WITH SUBSTRATE BACKSIDE PURGING AND THERMAL SINKING

BACKGROUND

The present application relates to an electrostatic substrate chuck. Electrostatic substrate chucks are widely used in a variety of fabrication tools, such as thin film deposition, plasma etch, photo-resist striping, substrate cleaning as well as lithography, ion implantation, etc.

Electrostatic chucks (ESC) operate by applying a charge of one polarity onto the chucking surface and a charge of the opposite polarity on a substrate. Since opposite charges attract, the substrate is held or clamped in place by the resulting electrostatic force.

SUMMARY

An ESC substrate pedestal is disclosed. The ESC substrate pedestal includes an electrostatic chuck having a chucking surface for chucking a substrate, a pedestal mount; and a pedestal stem arranged to support the electrostatic chuck and to be mounted to the pedestal mount. The pedestal stem includes (a) a stem wall having one or more conduits provided within or adjacent to the stem wall for supplying a gas to the electrostatic chuck, (b) a heat exchange surface for exchanging heat from the stem wall to a heat sinking element provided on the pedestal mount and (c) a seal interface arranged to interface with a seal that is provided between the stem wall and the pedestal mount, wherein the seal interface is offset from the heat exchange surface on the cylindrical wall of the stem by a sufficient distance so that the seal is subject to less heat relative to the heat exchange surface.

In a non-exclusive embodiment, the pedestal stem is cylindrical in shape and defines an exterior cylinder wall surface and an internal cylinder wall surface and the one or more conduits are formed between the exterior cylinder wall surface and the exterior cylinder wall surface respectively.

In another non-exclusive embodiment, the pedestal stem includes a first distal end arranged to support the electrostatic chuck and a second distal end including the seal interface arranged to interface with the seal. The heat exchange surface is intermediate the first distal end and the second distal end of the pedestal stem.

In another non-exclusive embodiment, the one or more conduits are in fluid communication with a gas distribution network provided on the electrostatic chuck, the one or more conduits arranged to supply the gas to the gas distribution network to create a positive gas pressure on a backside of the substrate when chucked to the chucking surface.

In another non-exclusive embodiment, the gas distribution network includes a pattern of channels and gas outlets arranged on the electrostatic chuck for evenly distributing the gas across the chucking surface.

In yet another non-exclusive embodiment, the chucking surface of the electrostatic chuck further includes a ring seal arranged to create a partial seal around the circumference of the substrate when chucked to the chucking surface, wherein the partial seal is arranged to allow positive gas flow from the backside of the substrate to atmosphere.

BRIEF DESCRIPTION OF THE DRAWINGS

The present application and the advantages thereof, may best be understood by reference to the following description taken in conjunction with the accompanying drawings in which:

FIG. 2B is an enlarged view of a pedestal stem of the electrostatic substrate pedestal.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

Figure 1:
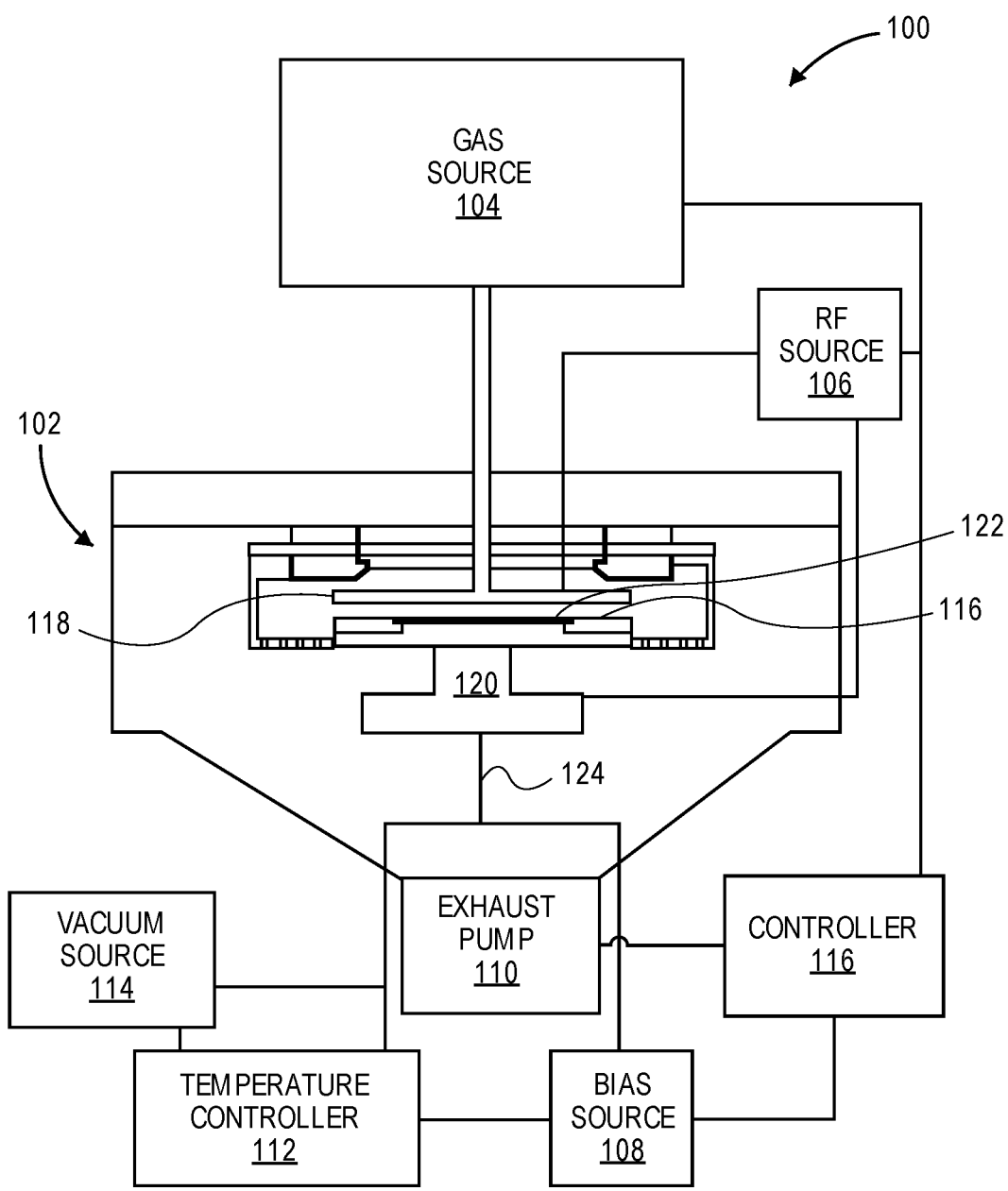
FIG. 1 is a block diagram of a substrate fabrication tool for processing a substrate in accordance with a non-exclusive embodiment.

FIG. 1 is a block diagram of a substrate processing tool 100 that may be used in a non-exclusive embodiment. The processing tool 100, in this example, includes a processing chamber 102, a gas source 104, a Radio Frequency (RF) source 106, a bias source 108, an exhaust pump 110, a temperature controller 112, vacuum source 114 and a controller 116.

The processing chamber 102 includes an element 118, coupled to RF source 106, and an electrostatic chuck (ESC) substrate pedestal 120 for chucking a substrate 122.

During operation of the tool 100, a substrate 122 is chucked onto the ESC substrate pedestal 120 within the processing chamber 102 containing a gas supplied by source 104. When RF power from source 106 is applied to plasma element 118, a plasma for processing the substrate 122 within the processing chamber 102 is created. Depending on the type of tool, the plasma may be used to process the substrate 122 in a number of ways, including thin film deposition, etching, etc.

Also during operation, the controller 116 may selectively control a number of operations within the chamber 102, such as the bias applied to the substrate 122 via the bias source 108, the exhausting of the plasma or other gases out of the chamber 102 via the exhaust pump 110, the temperature of the substrate pedestal 120 and/or the substrate 122 via the temperature controller 112 and the vacuum source 114. As each of these elements and their operation are well known, a detailed explanation is not provided herein for the sake of brevity.

In FIG. 1, the various electrical and/or supply tubing (hereafter referred to as generally as "plumbing") are provided between the various components 108 through 116 and the substrate pedestal 120. It should be noted that, for the sake of not over-complicating the details of the drawing, this arrangement as illustrated is simplified as a single connection 124. It is well understood that routing of the various electrical and supply tubing in and out of the chamber 102 and/or the substrate pedestal 120 is complex, but is not addressed herein for the sake of brevity.

In one specific, but non-exclusive embodiment, the tool 100 is an Atomic Layer Deposition (ALD) tool. In this particular embodiment, a thin-film deposition is grown on a substrate by exposing its surface to alternate gaseous species, typically referred to as precursors. For instance, a first precursor may be added to the chamber 102 in a first processing step. After the first precursor material has been absorbed or deposited onto the surface of the substrate, any excess is removed from the chamber 102. Then, in a second processing step, a second precursor is introduced into the chamber 102 and deposited onto the surface of the substrate. When this step is complete, any excess of the second precursor is removed from the chamber 102. The above process may be repeated multiple times until a film of desired thickness is achieved. For instance, a particular but non-exclusive ALD process may include in multiple steps (1) application of precursor, (2) a purge of the chamber of precursor, (3) reacting or conversion of deposited precursor with plasma, and then (4) repeat of this 3-step process multiple times. In yet other embodiments, other steps not describe herein may be used as needed.

Although ALD tools are capable of depositing very thin films, their use is problematic for several reasons. Both the substrate and substrate pedestal are subject to intense heat during deposition. Such heat may cause various seals and other equipment provided on the substrate pedestal to fail. Another issue with ALD tools is that particles of the deposited film material can be so small that they may incidentally deposit on the back surface of the substrate. In this application, the Applicants have devised a solution to these issues as described in detail below.

Figure 2A:
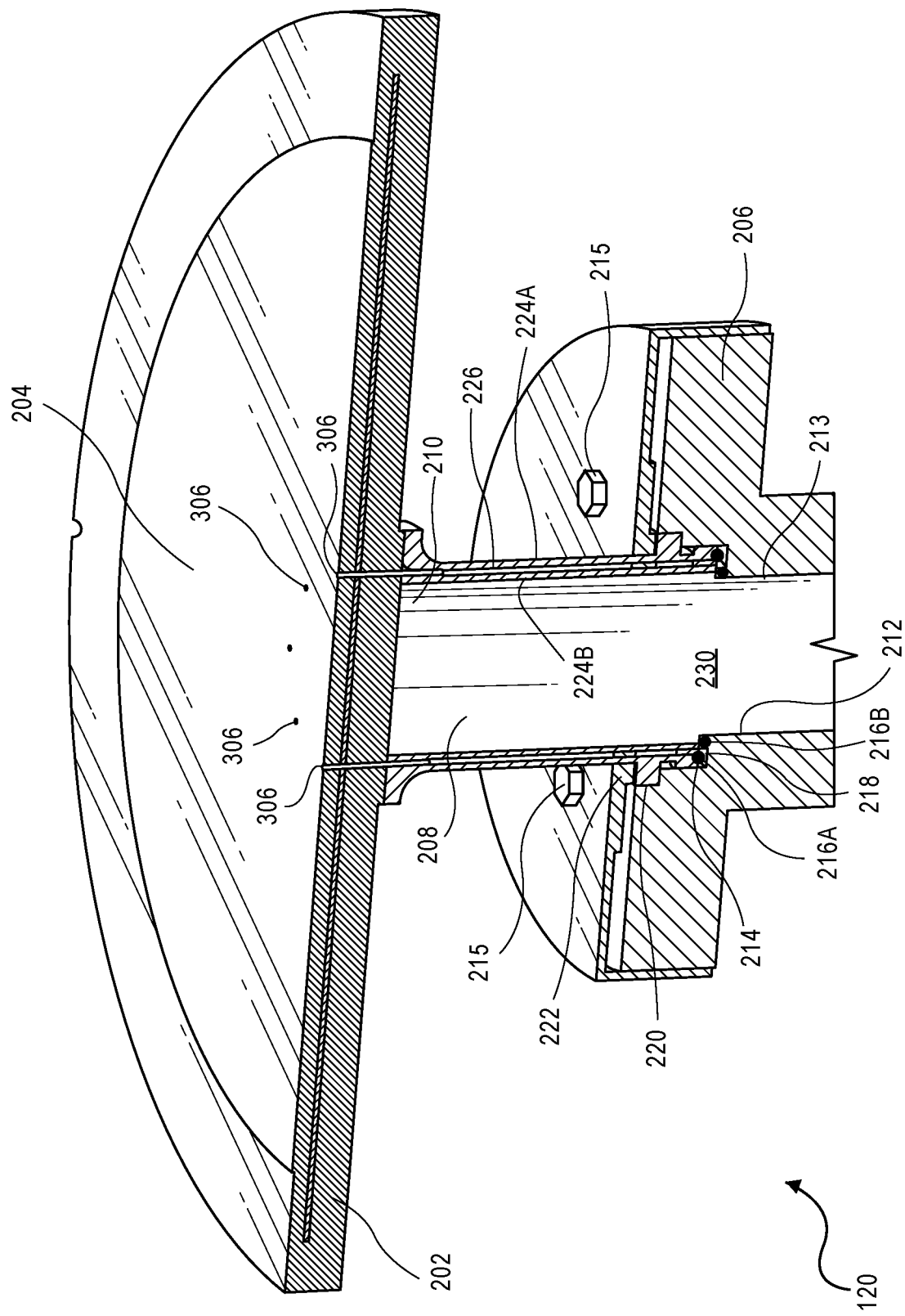
FIG. 2A is a cross-sectional diagram of an electrostatic substrate pedestal in accordance with another non-exclusive embodiment.

Referring to FIG. 2A, a cross-sectional diagram of the ESC substrate pedestal 120 in accordance with a non-exclusive embodiment is shown. The ESC substrate pedestal 120 includes an ESC chuck 202 having a chucking surface 204 for chucking a substrate (not shown), a pedestal mount 206 and a pedestal stem 208 that is arranged to support the ESC chuck 202 and to be mounted onto a recess 213 provided in the pedestal mount 206.

The pedestal stem 208 includes a first distal end 210 arranged to support the ESC chuck 202 and a second distal end 212. Near the distal end 212, a seal interface 214 is provided to interface with a seal that sits between an opposing second seal interface 218 in the recess 213 of the pedestal mount 206. In a non-exclusive embodiment, the seal includes a multiple o-rings 216A and 216B made of elastomers compatible with chemistries and temperatures, such as perfluoronated or fluorinated elastomers. In alternative embodiments, the seals 216A and 216B may be fluorocarbon, silicone, or fluorinated. In yet other embodiments, the seals 216A and 216B are capable of operating at 150 degrees C. or higher, ideally for extended periods of time with a minimal risk of failure.

The pedestal stem 208 also includes heat exchange element 220 that is intermediate the first distal end 210 and the second distal end 212 of the pedestal stem 208. In a non-exclusive embodiment, the heat exchange surfaces 220 is a protrusion that extends outwardly from the stem wall 208 and is arranged to be in thermal contact with a heat sinking elements 222 provided on the pedestal mount 206. With this arrangement, both the elements 222 and the pedestal mount 206 sink heat.

Mechanical fastening elements 215, such as bolts or screws, are arranged to mechanically fasten the heat sink element 222 and the pedestal stem 208 to the pedestal mount 206. When assembling the substrate pedestal 120, the pedestal stem is inserted into the recess 213 of the pedestal mount 206. The heat sinking element 222 is then mounted on top of the pedestal mount 206 such that the protrusion defining the heat exchange surface 220 protruding from the pedestal stem 208 is "sandwiched" between heat sinking elements 222 and the pedestal mount 206. Thus, when fastened by elements 215, the three components are fastened together in a single assembly. For ease of assembly, the heat sinking element 222 can be segmented into multiple parts. For example, the heat sinking element 222 can be made from two or more plates (e.g., two 180 degree semi-circular plates designed to surround the pedestal stem 208).

It is noted that the heat exchange surface 220 is offset from the seal interface 214 and the seals 216A/216B along the length of the pedestal stem 208. With this arrangement, heat generated during processing of a substrate chucked on the chucking surface 204 is at least partially transferred to the heat sinking element 222 before reaching the location of the seals 216A and 216B. As a result, the seals 216A and 216B are maintained at a relatively lower temperature than at the heat exchange surface 220 of the pedestal stem 208.

In yet other non-exclusive embodiments, the pedestal stem is cylindrical in shape and defines an exterior cylinder wall surface 224A and an internal cylinder wall surface 224B. One or more conduits 226 are formed between the exterior cylinder wall surface 224A and the interior cylinder wall surface 224B respectively. Alternatively, the one or more conduits (not illustrated) are provided adjacent either the exterior and/or interior cylinder wall surfaces 224A and/or 224B. It should be noted that the term "conduit" as used herein should be widely construed to cover any passageway for transporting a gas, such as but not limited to tubes, a hollow cylinder, fluid line, duct, pipeline, hose, etc.

The one or more conduits 226 are in fluid communication with a gas distribution network (not illustrated in FIG. 2) provided on the ESC chuck 202.

In yet other embodiments, the pedestal stem 208 may be made of a number of thermally conductive materials. Such materials may include, but are not limited to aluminum nitride, aluminum oxide, ceramic, other thermally conductive materials, or any combination thereof.

FIG. 2B is an enlarged view of a pedestal stem 208 of the ESC substrate pedestal 120 showing a better view of many of the features described above. Specifically, FIG. 2B illustrates:

(a) The heat exchange surface 220 that extends or protrudes outward from the stem wall 208 and is arranged to be in thermal contact with the heat sinking element 222 provided on the pedestal mount 206;

(b) The seal interface 214 arranged to interface with the o-ring seals 216A and 216B that sits between the opposing second seal interface 218 located in the recess 213 of the pedestal mount 206; and (c) The gas conduit(s) 226 formed between the exterior cylinder wall surface 224A and the internal cylinder wall surface 224B of the pedestal stem 208.

As more clearly evident in FIG. 2B, the heat exchange surface 220 and the seal interface 214 are offset by a distance 235.

In various embodiments, the offset range may vary significantly. For instance, the offset may range from approximately 0.25 inches (6.35 mm) or more, from 0.25 to 8.0 inches (203.2 mm) or more, from 0.25 to 1.5 inches (38.1), from 0.5 to 5.0 inches (12.7 mm to 127 mm) or any other suitable offset more than 0.25. The actual offset dimension 235 used in a given embodiment may vary depending on several factors, such as the length of the pedestal stem 208, the amount of heat that needs to be dissipated, the type and/or longevity of the seals 216A and/or 216B to withstand heat, etc. As such, with specific but non-exclusive embodiments, the offset dimension 235 may be any value beyond 0.25 inches (6.25 mm). It should be understood that any particular dimensions provided herein are meant to be exemplary and not limiting. In general, the larger the offset distance, typically the greater the temperature differential.

Also, in non-exclusive embodiments, the seals 216A and/or 216B are maintained at approximately 200 degrees C. or less, and preferably around 150 to 160 degrees C. Again, it should be understood that these temperature values are merely illustrative and are not intended to be limiting. In actual embodiments, a wide range of temperature differentials and target temperatures may be used.

Finally, the arrangement of the conduit(s) 226 shown is not intended to be limiting. As previously noted, the conduits can also be positioned adjacent either the exterior cylinder wall surface 224A and/or the internal cylinder wall surface 224B.

With the above described arrangement, the center region 230 of the pedestal stem 208 is relatively unoccupied. As a result, space is available to run electrical cables, supply houses, etc. (e.g., the "plumbing") from the various components 108 through 114 through this center 230 region to the electrostatic chuck 202.

Figure 3:
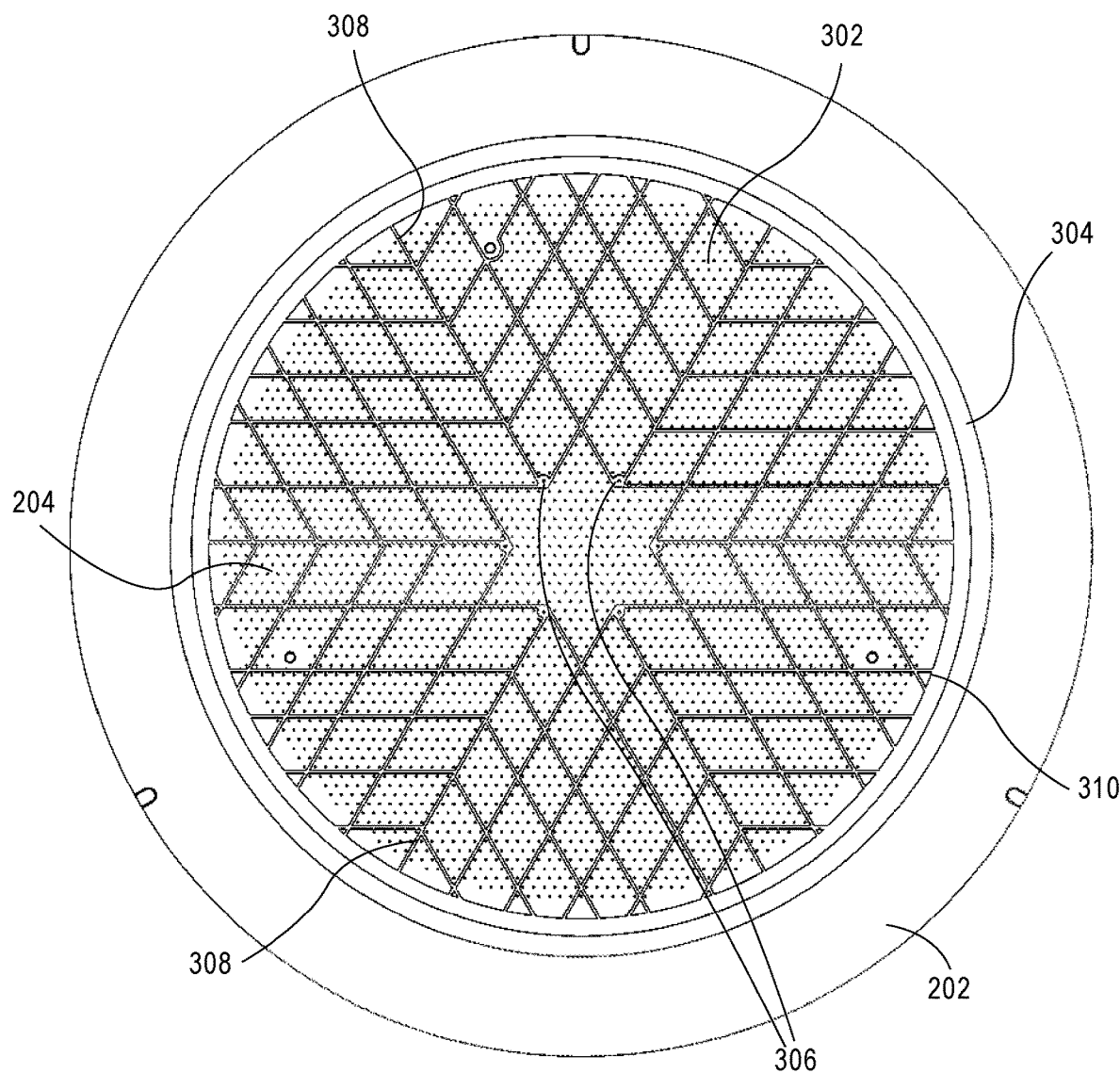
FIG. 3 is a view of a chucking surface of the electrostatic substrate pedestal in accordance with yet another non-exclusive embodiment.

Referring to FIG. 3, a top view of the chucking surface 204 of the electrostatic chuck 202 is shown. In this embodiment, the surface 204 includes a gas distribution network 302 and a ring seal 304.

The gas distribution network 302 includes gas outlets 306, a grid of channels 308 and an equalization ring 310. The gas outlets 306 are in fluid communication with the one or more conduits 226 that provide the supply of gas to the electrostatic chuck 202 via the pedestal stem 208. The gas, supplied via the outlets 306, is then distributed adjacent the backside of the substrate 122 via the channels 308. The equalization ring 310 helps equalize the gas pressure across the chucking surface 204. As a result, a positive, substantially equal, pressure is created over the surface area of the backside of the substrate 122.

The ring seal 304 is arranged to contact the periphery or circumference of a substrate 122 when chucked onto the surface 204. The ring seal 304 is arranged to create a partial seal, meaning positive-pressure gas on the backside of the substrate 122 is allowed to slowly escape into the sounding atmosphere in the chamber 102. In other words, the positive gas flow purges or prevents deposition material and/or other particles or contaminants from entering the space between the backside of the substrate 122 and the chucking surface 204. As a result, incidental deposition or contamination is avoided or significantly reduced.

In addition, the gas can also be used for cooling by enhancing thermal conduction between the substrate 122 and the chucking surface 204.

In various embodiments, the positive pressure created by the gas ranges from approximately 10 to 30 Torr. In one particular embodiment, the gas used is helium. However, other purge gases may be used, including nitrogen, argon, or other inert gas.

In a non-exclusive embodiment, the ring seal 304 is made from highly polished and flat ceramic. In other embodiments, the ring seal 304 is made from primarily flat material, typically, less than a flatness of 0.001 inches (0.0254 mm) for every 12 inches (304.8 mm) of distance. Again, these flatness characteristics are merely exemplary and a ring seal having either more or less flatness characteristics may be used.

It is noted that the specific embodiment illustrated in FIG. 3 is exemplary and should not be construed as limiting in any manner. For example, the number of gas outlets 306 can be more or less than the six (6) shown in this particular embodiment. In yet other embodiments, each gas outlet 306 is connected to a dedicated conduit 226. In other embodiments, a conduit 226 can supply more than one outlet 306. In addition, the grid of the channels 308 can assume any pattern and is not limited to the "star" pattern as illustrated.

The above described embodiments thus solves a number of issues, including:

(1) Providing a gas, such as helium or other purge gas, through the pedestal stem 208 so that a pressure can be created on the back surface the substrate 122 when chucked. This positive pressure aids in preventing incidental contamination and deposits of thin film material and also helps cool the substrate.

(2) The arrangement of the gas conduits 226, either within the walls or adjacent to the walls of the pedestal stem 208, allows the purging gas to be supplied to the chucking surface 204. In addition, space 230 within the pedestal stem 208 is freed to allow other necessary "plumbing" to be supplied to the electrostatic chuck 202; and (3) The offset of the seals 216A and 216B from the sinking of heat at the heat exchange surface 220 results in significantly lower temperatures in the vicinity of the seals 216A and 216B. As a result, the likelihood of the seals 216A and 216B melting and/or failing is significantly reduced.

It should be understood that while the present application is described in the context of a ADL tool, by no means this be construed as limiting. On the contrary the ESC substrate pedestal 120 as described herein may be used in a wide variety of substrate processing tools, including but not limited to, chemical vapor deposition tools, lithography tools, plasma etching or chemical etching tools, ion implantation tools, substrate cleaning tools, etc.

Although only a few embodiments have been described in detail, it should be appreciated that the present application may be implemented in many other forms without departing from the spirit or scope of the disclosure provided herein. For instance, the substrate can be a semiconductor wafer, a discrete semiconductor device, a flat panel display, or any other type of work piece.

Therefore, the present embodiments should be considered illustrative and not restrictive and is not to be limited to the details given herein, but may be modified within the scope and equivalents of the appended claims.

What is claimed is:

1. An electrostatic chuck (ESC) substrate pedestal, comprising:
   an electrostatic chuck having a chucking surface for chucking a substrate,
   a pedestal mount
   a heat sinking element provided on the pedestal mount; and
   a pedestal stem arranged to support the electrostatic chuck and to be mounted to the pedestal mount, the pedestal stem including:
   (a) a stem wall having one or more conduits provided within or adjacent to the stem wall for supplying a gas to the electrostatic chuck;
   (b) a heat exchange surface for exchanging heat from the stem wall to the heat sinking element provided on the pedestal mount, wherein the heat exchange surface is a protrusion extending laterally outward from the stem wall, the protrusion arranged to thermally contact both the heat sinking element and the pedestal mount, wherein the protrusion is sandwiched between a portion of the heat sinking element and a portion of the pedestal mount; and (c) a seal interface arranged to interface with a seal that is provided between the stem wall and the pedestal mount, wherein the seal interface is offset from the heat exchange surface on the wall of the stem by an offset distance so that the seal is subject to less heat relative to the heat exchange surface, wherein the pedestal stem includes:
a first distal end arranged to support the electrostatic chuck; and
a second distal end including the seal interface arranged to interface with the seal,
wherein the heat exchange surface is intermediate the first distal end and the second distal end of the pedestal stem.

2. The ESC substrate pedestal of claim 1, wherein the offset distance is more than 0.25 inches (6.35 mm).

3. The ESC substrate pedestal of claim 1, wherein the pedestal mount further includes:
a recess for accepting the pedestal stem; and
a second seal interface arranged to oppose the seal interface of the stem wall when the stem wall of the pedestal stem is positioned within the recess of the pedestal mount,
wherein the seal is one or more o-ring(s) that is/are positioned between the seal interface of the stem wall and the second seal interface of the pedestal mount.

4. The ESC substrate pedestal of claim 1, wherein the seal is maintained at a temperature of 200 degrees C. or less.

5. The ESC substrate pedestal of claim 1, wherein the pedestal stem is cylindrical in shape and defines an exterior cylinder wall surface and an internal cylinder wall surface and the one or more conduits are formed between the exterior cylinder wall surface and the exterior cylinder wall surface respectively.

6. The ESC substrate pedestal of claim 1, wherein the one or more conduits are provided adjacent to either an external or an internal wall of the pedestal stem.

7. The ESC substrate pedestal of claim 1, wherein the pedestal stem is made at least partially from at one of the following:
(a) aluminum nitride;
(b) aluminum oxide;
(c) ceramic;
(d) a thermally conductive material; and
(e) any combination of (a) through (d).

8. The ESC substrate pedestal of claim 1, wherein the one or more conduits are in fluid communication with a gas distribution network provided on the electrostatic chuck, the one or more conduits arranged to supply the gas to the gas distribution network to create a positive gas pressure on a backside of the substrate when chucked to the chucking surface.

9. The ESC substrate pedestal of claim 8, wherein the positive gas pressure ranges from 10 to 30 Torr.

10. The ESC substrate pedestal of claim 8, wherein the gas distribution network includes a pattern of channels and gas outlets arranged on the electrostatic chuck for evenly distributing the gas across the chucking surface.

11. The ESC substrate pedestal of claim 1, wherein the chucking surface of the electrostatic chuck further comprises a ring seal arranged to create a partial seal around a circumference of the substrate when chucked to the chucking surface, wherein the partial seal is arranged to allow positive gas flow from a backside of the substrate to atmosphere.

12. The ESC substrate pedestal of claim 11, wherein the ring seal is ceramic.

13. The ESC substrate pedestal of claim 1, wherein the gas supplied to the electrostatic chuck is a purge gas that is used to prevent incidental deposition of material onto a backside of the substrate when chucked to the chucking surface.

14. The ESC substrate pedestal of claim 1, wherein the gas is one of the following:
(a) helium;
(b) nitrogen;
(c) argon: or
(d) an inert gas.

15. The ESC substrate pedestal of claim 1, wherein the heat sinking element is a circular plate, including two or more segments, that are mechanically fastened to the pedestal mount.

16. The ESC substrate pedestal of claim 1, further comprising one or more mechanical fasteners to mechanically fasten the pedestal stem, the pedestal mount and the heat sinking element into an assembly.

17. The ESC substrate pedestal of claim 3, wherein the one or more o-ring(s) are made from an elastomer capable of withstanding a temperature of at least 150 degrees C.

18. The ESC substrate pedestal of claim 3, wherein the one or more o-ring(s) are made from an elastomer selected from the group including:
Perfluoronated elastomers;
Fluorinated elastomers;
Fuorocarbon elastomers; or
Silicone elastomers.

19. The ESC substrate pedestal of claim 11, wherein the ring seal is flat and has a flatness of 0.001 inches (0.0254 mm) or less for every 12 inches (304.8 mm) of distance.

* * * * *